(12) United States Patent
Steinich (10) Patent No.: US 9,816,843 B2
(45) Date of Patent: Nov. 14, 2017

(54) MAGNETORESTRICTIVE POSITION SENSOR ACCORDING TO THE PROPAGATION TIME PRINCIPLE HAVING A MAGNETORESTRICTIVE DETECTOR UNIT FOR MECHANICAL-ELASTIC DENSITY WAVES

(75) Inventor: Klaus Manfred Steinich, Zorneding / Pöring (DE)

(73) Assignee: ASM Automation Sensorik Messtechnik GmbH, Moosinning (DE)

( * ) Notice: Subject to any disclaimer, the term of this patent is extended or adjusted under 35 U.S.C. 154(b) by 1093 days.

(21) Appl. No.: 13/141,300

(22) PCT Filed: Dec. 30, 2009

(86) PCT No.: PCT/EP2009/068022
§ 371 (c)(1),
(2), (4) Date: Jul. 29, 2011

(87) PCT Pub. No.: WO2010/076330
PCT Pub. Date: Jul. 8, 2010

(65) Prior Publication Data
US 2012/0001622 A1 Jan. 5, 2012

(30) Foreign Application Priority Data
Jan. 2, 2009 (DE) .............. 10 2009 003 924

(51) Int. Cl.
*G01R 33/09* (2006.01)
*G01D 5/48* (2006.01)
*G01B 7/14* (2006.01)

(52) U.S. Cl.
CPC .............. *G01D 5/485* (2013.01); *G01R 33/09* (2013.01); *G01B 7/14* (2013.01)

(58) Field of Classification Search
CPC . G01D 5/485; G01B 7/14; G01B 7/30; G01R 33/02; G01R 33/06; G01R 33/09; G01R 33/091; G01R 33/093; G01R 33/095; G01R 33/096; G01R 33/098
USPC ............ 324/207.13, 207.14, 207.21, 207.24, 324/207.26; 73/862.333–862.336
See application file for complete search history.

(56) References Cited

U.S. PATENT DOCUMENTS

| | | | | |
|---|---|---|---|---|
| 5,017,867 A | * | 5/1991 | Dumais et al. | 324/207.13 |
| 5,412,317 A | * | 5/1995 | Kyoizumi | 324/207.14 |
| 5,477,143 A | * | 12/1995 | Wu | G01V 3/08 |
| | | | | 324/207.21 |
| 5,508,611 A | * | 4/1996 | Schroeder et al. | 324/252 |
| 6,215,122 B1 | * | 4/2001 | Clifford et al. | 250/369 |
| 6,401,883 B1 | | 6/2002 | Nyce et al. | |

(Continued)

FOREIGN PATENT DOCUMENTS

| DE | 10201880 | 7/2003 |
|---|---|---|
| DE | 10351650 | 3/2005 |

(Continued)

*Primary Examiner* — David M. Schindler
(74) *Attorney, Agent, or Firm* — Head, Johnson, Kachigian & Wilkinson, PC (57) ABSTRACT

Instead of tapping a mechano-elastic desnity wave (MEDW) from a wave conductor or a Villary band through a detector coil, a changing field strength H is captured by a XMR sensor which is positioned on a wave conductor or proximal to the wave conductor or on a Villary band or proximal to the Villary band.

2 Claims, 11 Drawing Sheets

(56) References Cited

U.S. PATENT DOCUMENTS

| | | | |
|---|---|---|---|
| 7,612,554 B2* | 11/2009 | Sprecher | 324/207.13 |
| 2004/0045353 A1* | 3/2004 | Patel | 73/290 R |
| 2009/0146645 A1* | 6/2009 | Steinich et al. | 324/207.13 |
| 2009/0153135 A1 | 6/2009 | Viola et al. | |
| 2009/0154292 A1 | 6/2009 | Viola et al. | |

FOREIGN PATENT DOCUMENTS

| | | | |
|---|---|---|---|
| EP | 0363518 | | 4/1990 |
| JP | 2009121862 A | * | 6/2009 |

* cited by examiner

MAGNETORESTRICTIVE POSITION SENSOR ACCORDING TO THE PROPAGATION TIME PRINCIPLE HAVING A MAGNETORESTRICTIVE DETECTOR UNIT FOR MECHANICAL-ELASTIC DENSITY WAVES

CROSS-REFERENCE TO RELATED APPLICATIONS

This application is a national phase application of PCT/EP2009/068022 and claims priority to German Patent Application No. 102009003924.4 filed Jan. 2, 2009 which is incorporated herein by reference.

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISC OR AS A TEXT FILE VIA THE OFFICE ELECTRONIC FILING SYSTEM (EFS-WEB)

Not Applicable

STATEMENT REGARDING PRIOR DISCLOSURES BY THE INVENTOR OR A JOINT INVENTOR

Not Applicable

BACKGROUND OF THE INVENTION

I. Field of the Invention

The invention relates to position sensors, in particular their detector unit, based on the runtime measurement principle for mechano-elastic density waves (MEDW) in a wave conductor which include a position element in addition to the wave conductor, wherein the position element is moveable relative to the wave conductor and generates or detects the MEDW.

II. Prior Art

The wave conductor is typically made from a tube, a wire or a band and can also be used as an electrical conductor. The wave conductor can furthermore be arranged in a shaping linear or circular element made from non-magnetic material, e.g. plastic or metal for receiving and storing the wave conductor.

Based on the Wiedemann effect, a power impulse fed into the wave conductor when superimposed with an external magnetic field laterally oriented relative to the magnetostrictive wave conductor, wherein the external magnetic field is caused by the position element, in particular a position magnet, causes a torsion impulse of a MEDW which propagates at a speed of approximately 2,500 m/s to 6,000 m/s from its origin thus e.g. the position of the position elements in both directions in the wave conductor as a function of the elasticity modulus or of the shear elasticity moduli of the wave conductor material employed.

At one location, typically at one end of the wave conductor in particular the torsion component of the mechano-elastic density impulse is detected by a detector unit which is typically in a fixed position with reference to the wave conductor. The time period between triggering the excitation power impulse and receiving the MEDW thus is a measure for the distance of the movable position element, e.g. of the position magnet from the detector device or also the coil or the electric magnet.

A typical sensor of this type is described in U.S. Pat. Nos. 5,590,091 and 5,736,855.

The main object of the present invention is the detector device.

A prior art detector device includes a detector coil which is either arranged about the wave conductor or arranged about a Villary band as a so-called Villary detector, wherein the Villary band extends from the wave conductor in particular at a 90° angle and is connected with the wave conductor in particular mechanically fixated, e.g. welded so that the torsion impulse running in the wave conductor is transformed in the Villary band into a longitudinal wave. A longitudinal wave of this type compresses or expands the magneto-elastic element, thus the wave conductor or the Villary band in an elastic manner in the crystalline range and thus changes its permeability p. The Villary band or the wave conductor for this purpose is made from a material with a maximum change of magnetic permeability $\Delta\mu_r$, e.g. from nickel or a nickel alloy or from other suitable materials. As a compromise between the desired properties thus also so-called constant module alloys have proven useful in which the temperature coefficient of the elasticity module and/or of the shear module can be influenced over wide temperature ranges and in particular can be kept constant. Thus, e.g. the form of a band material with intrinsic stability and a thickness of approximately 0.05 to 0.2 mm and 0.5 to 1.5 mm width are being used.

Due to $$\Delta U \approx -N \times \frac{\Delta\phi}{\Delta t} \rightarrow \Delta U \approx -N \times \frac{\Delta B \times A}{-\Delta t} = N \times A \times \frac{\mu_0\mu_0 \times \Delta\mu\Gamma \times H}{\Delta t}$$

The following result is achieved:

$$\Delta U \approx \frac{\Delta\mu r}{\Delta t} \times K$$

since the values for $\mu_0$ I, N, L can be presumed to be constant.

The mechano-elastic density wave running through a magneto-elastic element e.g. the Villary band thus provides a voltage change $\Delta U$ which can be tapped at the detector coil as a usable signal.

It is apparent that the usable signal $\Delta U$ is the greater, the greater the change of the magnetic permeability $\Delta\mu_r$.

Additionally a portion of the curve $\Delta\mu_r(H)$ plotted as an operating point or operating portion of the curve $\Delta\mu_r(H)$, thus of the magnetic permeability over the magnetic field strength is desirable in which the magnetic permeability $\Delta\mu_r$ changes in a possibly linear manner in the strongest way possible relative to its cause. Therefore it is attempted to configured the function $\Delta\mu_r(H)$ in the rising flank as steep as possible and to establish the operating portion therein in the approximately linear portion.

In the prior art a so-called bias magnet configured as a permanent magnet is used for adjusting the operating point, wherein the bias magnet is arranged physically proximal to the detector coil, e.g. parallel to the Villary band.

The operating point of the mechano-elastic detector unit besides the magnetic parameters of the bias magnet is mostly dependent from its positioning relative to the detector coil.

However, it is a disadvantage that detector coils are relatively large and not extremely reliable.

When they shall be additionally protected against interference from magnetic fields through a housing made from ferrite material they also become respectively large.

As magneto-resistive elements additionally field plates, hall sensors and XMR-sensors are known. These, however, due to their lower sensitivity and the higher background noise are less effective and therefore have not been used for this application so far.

Thus while hall sensors react to a change of magnetic induction (B), XMR-sensors, thus thin layer sensors which change their resistances as a function of magnetic flux strength and orientation react directly to a change of the magnetic field strength (H) and its direction.

Thus the term "XMR" sensor is a general term for different types of magneto-resistive (MR-sensors), namely e.g.

AMR sensors which use the anisotrope-magneto-resistive effect

GMR sensors which use the giant-magneto-resistive effect

TMR sensors which use the tunnel-magneto-resistive effect

CMR sensors which use the colossal-magneto-resistive effect

GMI sensors which use the giant-magneto impedance effect, and

MTJ sensors which use the magnetic-tunneling junction-effect.

The disadvantage of reduced sensitivity, however, is balanced by simple producability or cost-effective availability and simple processability and simple mechanical handling of XMR sensors typically provided in the form of a microchip.

BRIEF SUMMARY OF THE INVENTION a) Technical Object

Thus, it is an object of the invention to provide a detector unit for a position sensor according to the runtime principle and a detection principle which can be produced and operated in a simple and cost-effective manner.

b) Solution

The object is achieved through the features of claims 1 and 15. Advantageous embodiments can be derived from the dependent claims.

Using an XMR sensor as a detector assembly in a position sensor according to the invention according to the runtime principle of a mechano-elastic wave overcomes the technical prejudice that sensors of this type have too little sensitivity and too high background noise and are therefore not usable for an application of this type at least when the microchips configured as so-called "bare chips" are used which are not yet applied to a support circuit board and which are not yet surrounded by a housing which facilitates positioning them on the circuit board of the position or ankle sensor very proximal to the wave conductor without a shielding there between, but typically with a shielding on the outside about the unit made from wave the conductor and the XMR chip.

In order to provide simple producability for a sensor an XMR sensor of this type configured as a microchip will typically be used.

In order to compensate the recited disadvantages, preferably additional measures are proposed which help to improve the usable signal relative to the background noise.

The XMR sensor is typically configured flat with its main plane or in case it is not configured flat, it is positioned with its main measuring orientation typically parallel to the magneto-elastic element to be scanned, thus the wave conductor itself or a Villary band attached thereto and transversally protruding therefrom.

Thus, the XMR sensor can be arranged at a small distance from the magneto-elastic element to be scanned or it can also directly contact the magneto-elastic element.

The XMR sensor is typically a silicon wafer which has contact points for electrical contacting and forwarding the signals on its front side so that the magneto-resistive element can be arranged on its backside at a distance or in a contacting manner. In case the sensor chip is arranged on a sensor circuit board this can also be provided on the backside of the sensor circuit board.

Preferably the sensor chip possibly including the circuit board supporting it can be arranged in a housing together with the magneto-resistive element, in particular encapsulated or encased therein.

It is another option that the XMR sensor like the Villary band is attached preferably at the same longitudinal position transversal from extending transversal from the wave conductor and thus in the same direction so that between the free end of the XMR sensor on the one hand side and of the Villary band on the other hand side a reinforcing bias magnet can be arranged which preferably contacts the two elements.

It is another option to centrally arrange and attach the XMR sensor on the wave conductor so that its main plane extends parallel to the direction of the wave conductor and to arrange a bias magnet also parallel thereto, preferably on the side of the sensor chip oriented away from the wave conductor or the circuit board carrying the sensor chip, wherein the pole orientation of the bias magnet extends parallel or at a right angle to the direction of the wave conductor.

The analogous solution with a Villary band includes attaching e.g. a U-shaped Villary band with both its free ends at the wave conductor at different axial positions and to arrange the XMR sensor with an additional bias magnet as previously described regarding the wave conductor at the center arm of the Villary band.

A signal improvement can also be achieved in that a respective XMR sensor is arranged along the wave conductor in a manner described supra more preferably through direct attachment at the wave conductor at two different axial positions. Thus, the distance in axial direction is preferably selected so that it corresponds to a single or multiple integer distance of wave peak and wave bottom of the magneto-elastic wave which moves along the wave conductor and which shall be detected. Mostly for reasons of redundancy this yields two signals which include a defined phase offset.

Regardless whether one or two XMR sensors are provided these can be attached at the magneto-resistive element, e.g. the wave conductor in a simple manner in that they include two circuit boards that are identical in particular with respect to their circumferential contour, wherein the circuit boards include conductive paths and/or soldering spots on their top sides and include a respective groove at an analogous location on their bottom and are glued relative to one another with their bottom sides. Thus, the two grooves provide a pass through opening in this interconnection.

This pass through opening e.g. provides that the wave conductor can be run through and can be connected with the circuit board interconnection e.g. through a crimp sleeve connected thereon, e.g. soldered.

Thus electronic components of the processing electronics can then be applied to the insertable outsides of the circuit board interconnection and also the XMR sensors can be applied as chips.

Two Villary bands can also be arranged at the wave conductor at the same axial position, wherein the Villary bands are attached on opposite sides of the wave conductor and protrude in the same transversal direction, so that an XMR sensor can be placed between the free ends of the two Villary bands, wherein the XMR sensor is then at a distance to the wave conductor and preferably connected with the two Villary bands.

A signal improvement can also be achieved in that the wave conductor itself goes through a simple or multiple curvature or bend at the scanning location and the XMR sensor is arranged in the interior radius of the curvature proximal to the wave conductor or at one of the Villary bands protruding at the respective location from the wave conductor.

In particular when the wave conductor is U-shaped through a double 90° bend, wherein the free interior cavity of the U-shape corresponds to the size of the XMR sensor and the XMR sensor is positioned in the interior cavity a very good usable signal can be provided, in particular when an additional bias magnet is arranged which extends with its pole orientation preferably parallel to the main plane of the XMR sensor, however at a right angle to the main orientation of the wave conductor and between the arms of the U-shaped wave conductor which extend parallel to one another.

An improvement of the measurement result can furthermore be achieved in that the point in time of an arrival of the mechano-elastic density wave in the wave conductor is not determined from a single analog signal which is put out by the detector assembly, in particular the XMR sensor.

Instead a single zero passage signal is generated through a constant fraction discriminator (CFD) from two analog signals which have different prefixes and a different amplitude, in particular through addition of the two analog signals and the zero passage of the zero passage signal as a point in time of arrival of the wave at the detection device.

The advantage is that this provides a signal in the form of the zero passage signal at which the zero passage is independent from the amplitude and the steepness of the output signals. Simultaneously an influence of external interferences is reduced and an influence of the so-called walking effect, thus a temperature induced change of the measurement result is reduced.

For this purpose either a position sensor with only one detector assembly, in particular an XMR sensor is used and the analog signal put out by the XMR sensor is once used in original form as the first required analog signal and on the other hand (this constitutes the real CFD method) the second required analog signal is generated therefrom through time offset by a time period which is shorter than the first flank of the signal in original form, inversion and multiplication by a factor below 1.

It is another option to arrange two separate detector assemblies at the position sensor, in particular XMR sensors and to use, triggered by the same start impulse the wave arriving at these two detector assemblies and triggered thereby respectively analog signals of the two detector assemblies directly for generating the zero passage signal therefrom, e.g. through addition or subtraction.

For this purpose the two sensors can be arranged at such an axial distance offset at the wave conductor so that the runtime of the wave for this distance is smaller than the time duration of the rising flank of the signal of one of the sensors. This saves the step of mathematically generating a time offset of both signals.

Furthermore the two sensors can be arranged at a different radial distance at the wave conductor, wherein the signal strength, thus the amplitude of the signals detected by the two sensors will be different, thus the lower amplitude with a factor below 1 relative to the higher amplitude. This saves a step of mathematically multiplying with a factor below 1.

The two signals are then subtracted from one another which leads to the same result as inverting one signal and adding the two signals provided thereafter.

When one of these physical arrangements is not selected but the two sensors are arranged at the same axial and/or radial position, respective computation steps are additionally required.

Furthermore a single XMR sensor is often not used as a sensor element but a respective temperature compensating bridge circuit including four particular XMR sensors, wherein two of them are magnetically shielded.

Additionally a shielding is provided against external magnetic fields in the form of a surrounding housing.

The method according to the invention thus includes scanning the magnitude and orientation of the magnetic flux H which is variable at the scanning position of the wave conductor through a sensor which reacts to the variation, e.g. an XMR sensor.

As an alternative thereto the magnetic induction which varies according to the formula $B=\mu \times H$ can be directly scanned through a respective sensor at this position instead of the magnetic field strength H.

In order to further improve measuring precision a zero passage signal is generated according to the CFD method recited supra from a single analog output signal, wherein the zero passage of the zero passage signal represents the point in time of arrival of the density wave.

Alternatively, the signals of the same density wave of two detector assemblies arranged at the position sensor e.g. offset in running direction of the wave and their analog signals arriving with a time differential from one another and having different amplitudes can be used for this purpose, wherein the signals are then subtracted from one another which is mathematically identical with an inversion of one of the two signals and a subsequent addition.

c) Embodiments

BRIEF DESCRIPTION OF THE DRAWINGS

FIGS. 1 *a*, *b* and *c* illustrate an arrangement of an XMR sensor directly on the wave conductor with only one XMR sensor;

DETAILED DESCRIPTION OF THE PREFERRED EMBODIMENTS

Figure 1A:
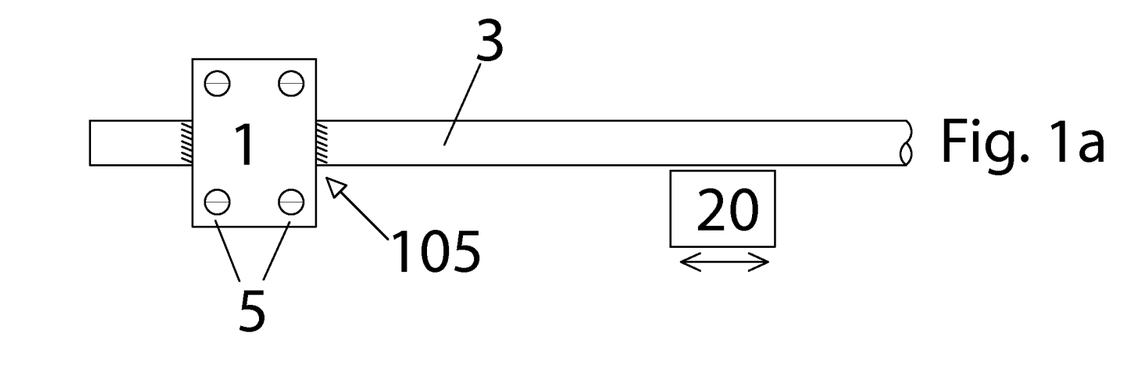

FIG. 1a initially illustrates the basic shape of a position sensor according to the run-time principal of a mechano-elastic density wave (MEDW).

Figure 1B:
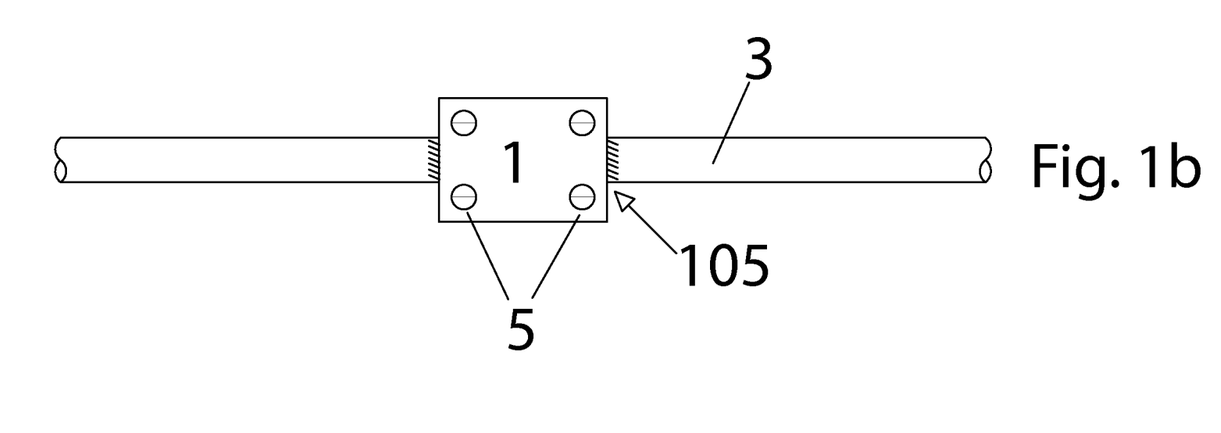
Figure 1C:
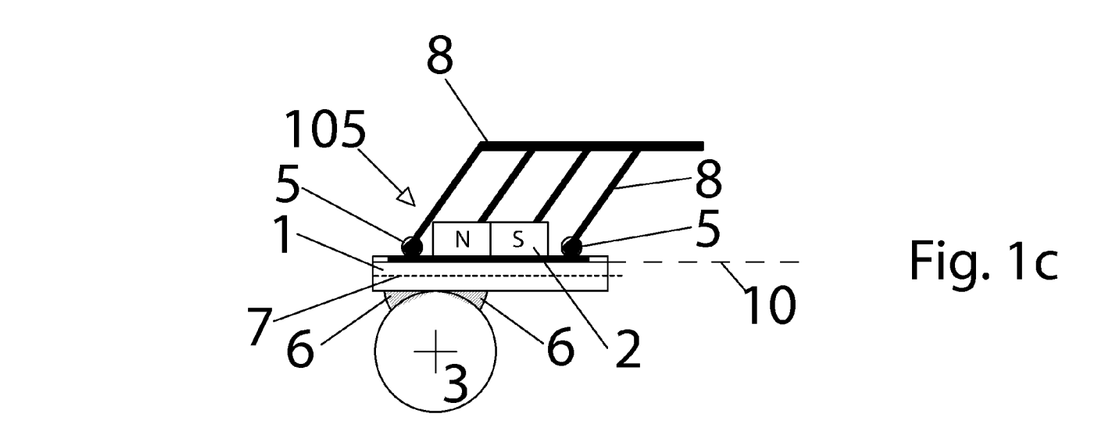

The wave conductor 3 extending in a straight line with a circular, typically solid cross section visible in FIG. 1c in the form of a rod or wire is configured at longitudinal position with a detector arrangement 105 for detecting a MEDW, wherein the MEDW is triggered by a position magnet 20 arranged proximal to the wave conductor 3 and influencing the wave conductor 3, wherein the position of the position magnet shall be determined as it is movable in longitudinal direction of wave conductor 20 and attached at a machine component whose position shall be detected.

Thus, the detector arrangement 105 is typically disposed at one end of the wave conductor 3, wherein only a position of the wave conductor 3 is illustrated in the following figures where the detector arrangement 105 is disposed which always includes at least one MXR sensor 1 in the form of sensor chip according to the invention in the subsequent drawing figures.

In FIG. 1 this plate shaped XMR sensor 1 is arranged and attached with its main plane 10 parallel to the longitudinal direction of the wave conductor 3 tangentially and laterally at the wave conductor 3, e.g. through solder joints 6 as illustrated in FIG. 1c. When the XMR sensor 1 is applied to a circuit board 7 the circuit board 7 is attached at the circumference of the wave conductor 3 with the side of the circuit board 7 that is oriented away from the sensor 1, e.g. soldered through solder joints 6, so that the sensor 1 protrudes in transversal direction to the wave conductor 3 on one side or on both sides beyond the cross-section of the wave conductor 3.

Since the sensor chip 1 is typically not square but rectangular, it can be arranged with its longitudinal direction in longitudinal direction of the wave conductor 1 as illustrated in FIG. 1b or perpendicular thereto as illustrated in FIG. 1a, wherein the main measuring direction of the sensor chip 1 typically is the greater extension of its rectangular basic shape and this direction should coincide with the highest sensitivity of the sensor, preferably with the longitudinal direction of the component to be scanned, thus the wave conductor or the Villary band.

When the sensor 1 is not applied to a circuit board 7 it can also be directly connected with the mechano-elastic element which shall be detected by the sensor with respect to its wave, in this case the wave conductor.

Figure 2A:
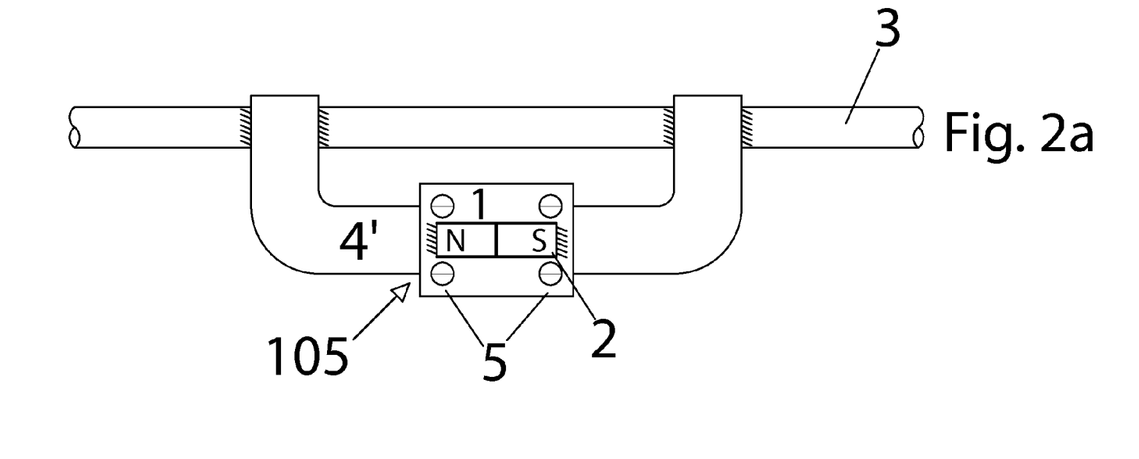
FIGS. 2*a* and *b* illustrate an XMR sensor at a center arm of a U shaped Villary-Band.

In the solution according to FIG. 2a the mechano-elastic element at which the XMR sensor 1 is attached is a Villary band 4, however compared to the normal configuration of a Villary band that protrudes on one side from the wave conductor 3, this is a U-shaped Villary band 4' which is attached in different longitudinal positions with both its free ends at the wave conductor 3, so that its connecting arm extends parallel to the longitudinal direction of the wave conductor 3.

The XMR sensor 1 is applied in turn at this connecting arm on one of the large surface outsides of the Villary band 4, wherein the XMR sensor additionally includes a bias magnet 2 for reinforcing the signal, thus on a top side oriented away from the Villary band 4' on which also contact points 5 for contacting through the signal conductors 8 for the XMR sensor 1 are disposed.

Figure 2B:
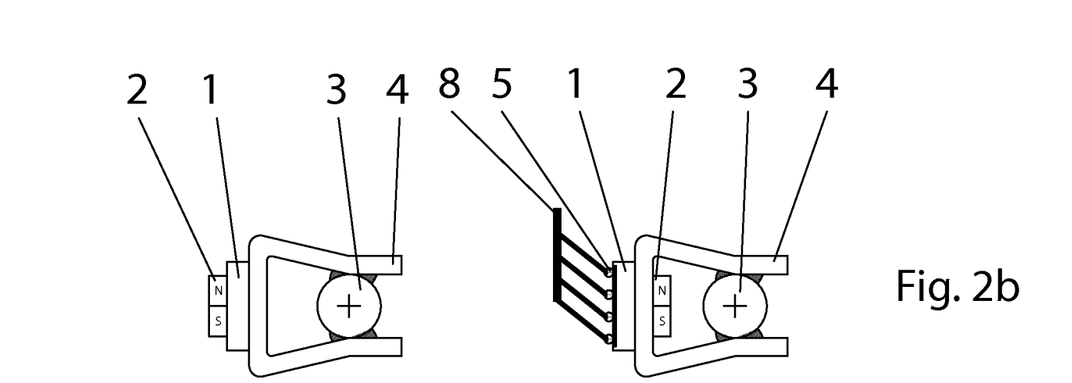

FIG. 2b illustrates a solution also with an U-shaped Villary band which is attached at the wave conductor 3 with both its ends, however with the main plane of the U-shape transversal to the extension of the wave conductor 3, so that the connecting arm of the U-shape is not parallel to the wave conductor, but skewed relative to the longitudinal direction of the wave conductor 3 at which then in turn an XMR sensor 1 and possibly a bias magnet 2 are arranged, either on opposite sides of the center arm of the Villary band 4 or also built on top of one another, so that the bias magnet 2 and the Villary band 4 are arranged on opposite sides of the XMR sensor 1.

Also in the solution according to FIG. 1 as illustrated in FIG. 1c a bias magnet 2 can also be arranged on the XMR sensor 1 on the opposite side of the wave conductor 3, wherein the XMR sensor 1 is then preferably positioned between the contact points 5 for the signal conductor 8 provided on the same side. The bias magnet is preferably arranged with its pole orientation parallel to the orientation of the highest sensitivity of the XMR sensor 1.

Figure 3:
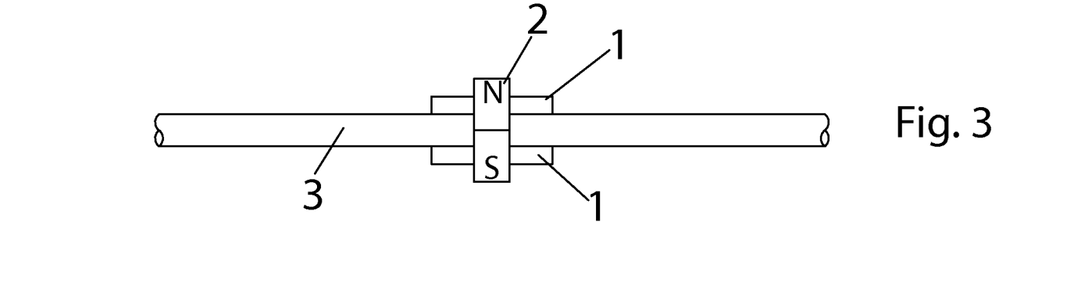
FIG. 3 illustrates an XMR sensor directly at the wave conductor with two opposite sensors at identical longitudinal positions.

FIG. 3 illustrates a solution which differs from the solution according to FIG. 1 in that two XMR sensors 1 are arranged parallel to one another on opposite sides of the cross-section of the wave conductor 3 at the wave conductor 3, wherein an additional bias magnet 2 can be arranged transversal to the main plane of the two XMR sensors 1 connecting both with its pole orientation.

Figure 4:
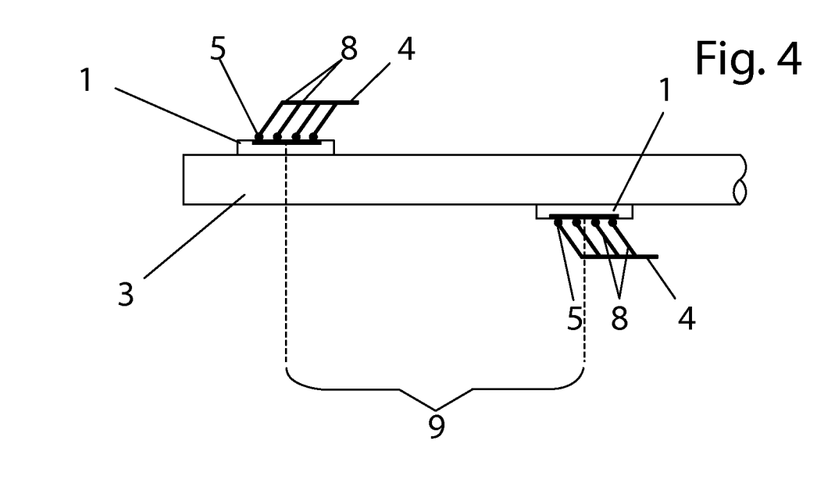
FIG. 4 illustrates an XMR sensor directly at the wave conductor with two opposite sensors in various longitudinal positions.

FIG. 4 illustrates a solution in which two XMR sensors 1 are also arranged on opposite sides of the cross-section of the wave conductor 3, but in longitudinal direction of the wave conductor 3 at two different longitudinal positions. The distance 9 of the longitudinal positions measured respectively from the center of one XMR sensor 1 to the center of the other XMR sensor 1 thus is an integer singular or multiple of the distance from wave peak to wave trough of the mechano-elastic density wave which shall be detected through the detector arrangement 105 when running along the wave conductor 3. Also here the contact points 5 with the signal conductors 8 originating therefrom are arranged on an outside of the sensor 1 respectively opposite to the wave conductor 3.

Figure 5A:
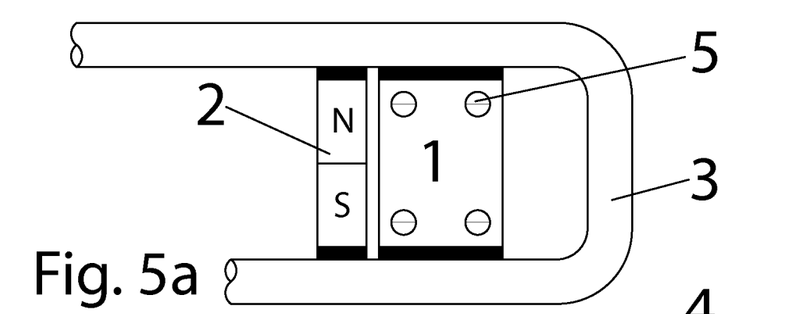
FIGS. 5a, b and c illustrate an XMR sensor in a bend of the wave conductor and/or of the Villary-Band.

FIG. 5 in turn illustrates a solution in which only one XMR sensor 1 is used for detection, however this time it is arranged in a double elbowed and thus U-shaped portion, preferably in an end portion of the wave conductor 3.

The free space in the interior of the U-shape is thus sized so that in particular the XMR sensor 1 fits in there with its main plane arranged in the main plane of the U-shape, possibly with a bias magnet 2 arranged adjacent thereto or arranged there above, wherein the pole orientation of the bias magnet is preferably arranged transversal to the main extension of the wave conductor 3. Herein, like also in all other cases the XMR sensor 1 can be positioned and mounted at a small distance from the mechano-elastic element to be detected, either the wave conductor 3 itself or a Villary band 4, or so that it contacts the wave conductor 3 or a Villary band 4.

Figure 5B:
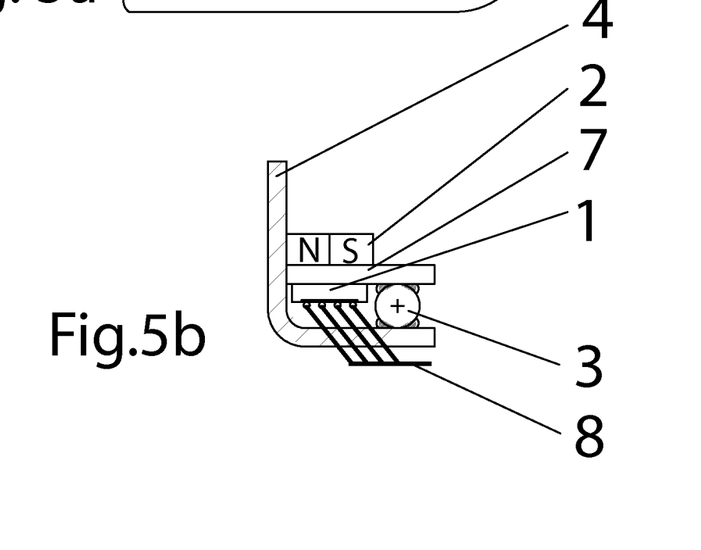
Figure 5C:
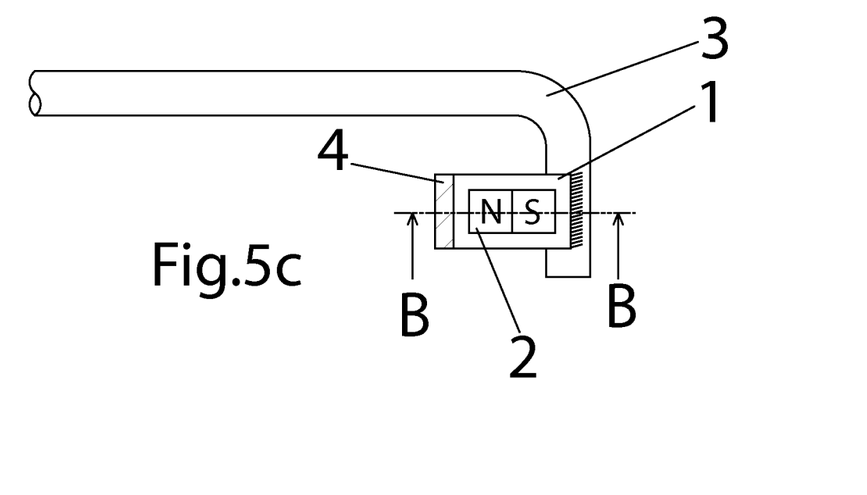

In the solution according to FIG. 5b and FIG. 5c a XMR sensor 1 is also arranged in a bend of the mechano-elastic element to be monitored, however this time in the inner angle of a Villary band 4 that is bent in a single bend by 90°, wherein the Villary band is fixated at the wave conductor 3 with one of its ends as usual.

The plane defined by the two arms of the Villary band 4, thus as illustrated in FIG. 5b is transversal to the longitudinal direction of the wave conductor 3 and the main plane of the XMR sensor 1 extends in parallel and preferably approximately at the level of the wave conductor 3 between the wave conductor 3 and the angled arm of the Villary band 4 further remote from the wave conductor 3.

This can be achieved in that the XMR sensor 1 is mounted on a circuit board 7 which is attached with one end on the outside of the wave conductor 3 and with the other end at the angled arm of the Villary band 4. When the XMR sensor 1 is then disposed on the same side of the circuit board as the wave conductor 3 they are both approximately at the same level.

Additionally a bias magnet 2 can be arranged in turn on the opposite side of the circuit board 7, preferably again with its pole orientation transversal to the longitudinal orientation of the wave conductor 3.

The signal improvement thus achieved is additionally influenced in a positive manner when the same assembly is arranged proximal to a bend of the wave conductor 3 and in its interior angle as evident in FIG. 5c.

Figure 6A:
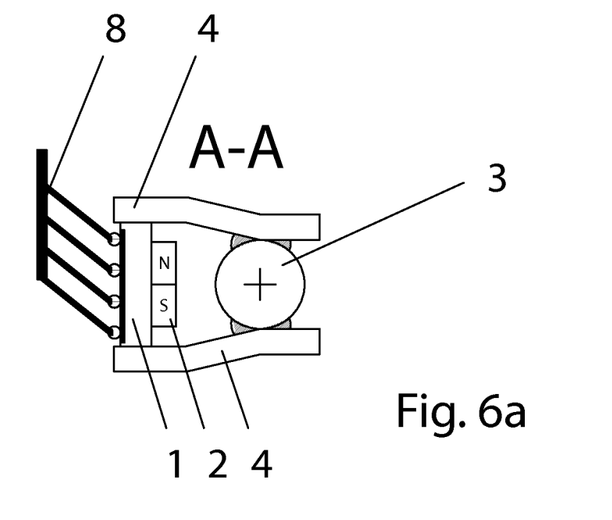
FIGS. 6a and b illustrate an XMR sensor between free ends of two Villery-Band at identical longitudinal positions.
Figure 6B:
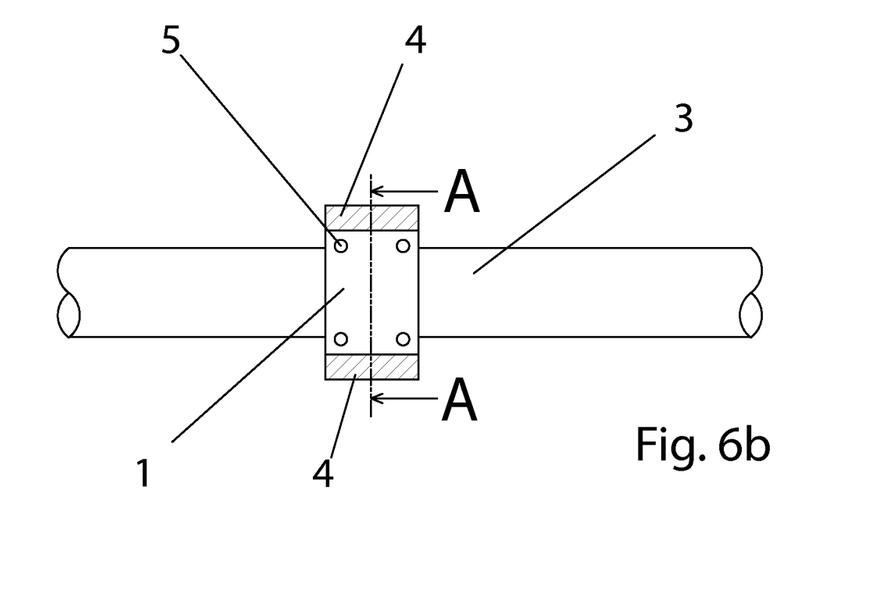

FIG. 6 on the other hand illustrates a solution in which a respective Villary band 4 is attached with one of its end at the cross-section at the wave conductor 3 at the same longitudinal position on opposite sides and protrudes with the other end into the same transversal direction so that an XMR sensor 1 can be mounted between the two free ends, wherein the main plane of the XMR sensor 1 extends parallel to the longitudinal direction of the wave conductor 3, but transversal to the longitudinal directions of the Villary band 4.

Since the extension of the XMR sensor 1 is greater than the cross-section of the wave conductor 3 the Villary bands 4 are preferably slightly angled or extend away from one another in a slight V-shape, thus they are not attached at the wave conductor 3 exactly opposite to one another.

Since the XMR sensor 1 is attached at the Villary bands 4 only with the narrow sides of the XMR sensor, its broad sides are provided on the one hand side for receiving the contact points 5 for the signal conductors 8 and on the other side for receiving a bias magnet 2 whose pole orientation preferably extends transversal to the longitudinal axis of the wave conductor 3.

Figure 7A:
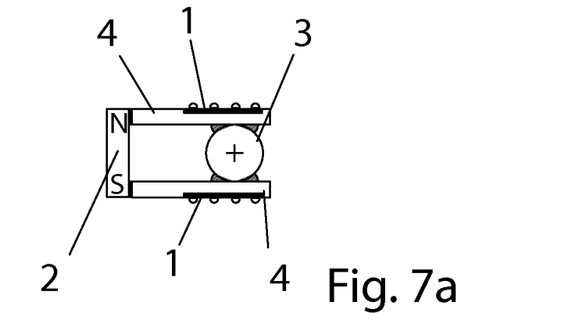
FIGS. 7a and b illustrate an XMR sensor between the free ends of two Villery-Bands at different longitudinal positions.
Figure 7B:
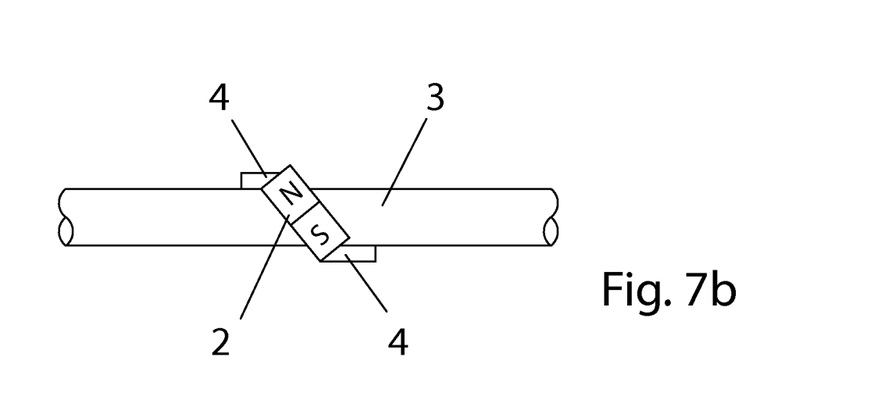

FIG. 7 illustrates a solution which differs from the solution according to FIG. 6 in that the two Villary bands 4 are also arranged on opposite sides of the cross-section of the wave conductor 3 but not at the same longitudinal position but approximately offset by half the length of a bias magnet 2 which is connected analogously to FIG. 6 with the two free ends of the two Villary bands 4. Each Villary band 4 is configured with a proper XMR sensor 1 so that a redundant configuration is achieved.

Figure 8:
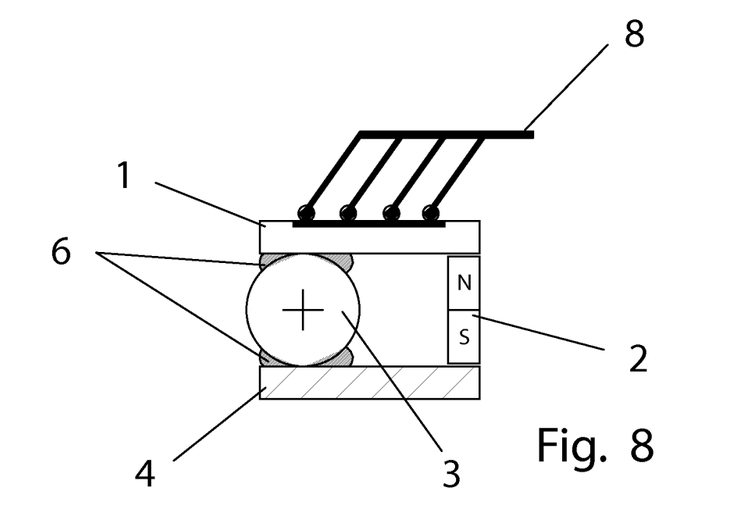
FIG. 8 illustrates an XMR sensor opposite to a Villery-Band.

FIG. 8 illustrates a solution in which, differently from the solution according to FIG. 6, one Villary band 4 and one XMR sensor 1 protrude in the same direction and slightly parallel to one another from the two opposite sides of a cross-section of a wave conductor 3 instead of two Villary bands, wherein preferably a bias magnet 2 is then arranged between the freely protruding ends of the two elements, preferably in turn with its pole orientation transversal to the longitudinal direction of the main planes of the XMR sensor 1 or the Villary band 4.

Figure 9:
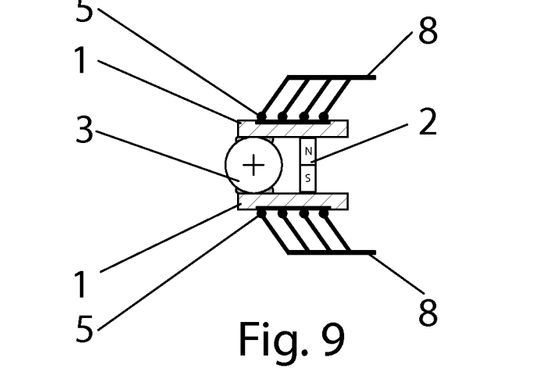
FIG. 9 illustrates two XMR sensors protruding in identical directions and arranged opposite to one another with respect to the wave conductor.

The solution of FIG. 9 illustrates a bias magnet 2 arranged in the same geometric assembly as in FIG. 6 instead of the two Villary bands 4 two XMR sensors 1 in turn with bias magnets 2 arranged between the free ends. The contact points 5 for the data conductors 8 are thus respectively arranged on the side of the XMR sensors 1 oriented away from the wave conductor 3.

Figure 10A:
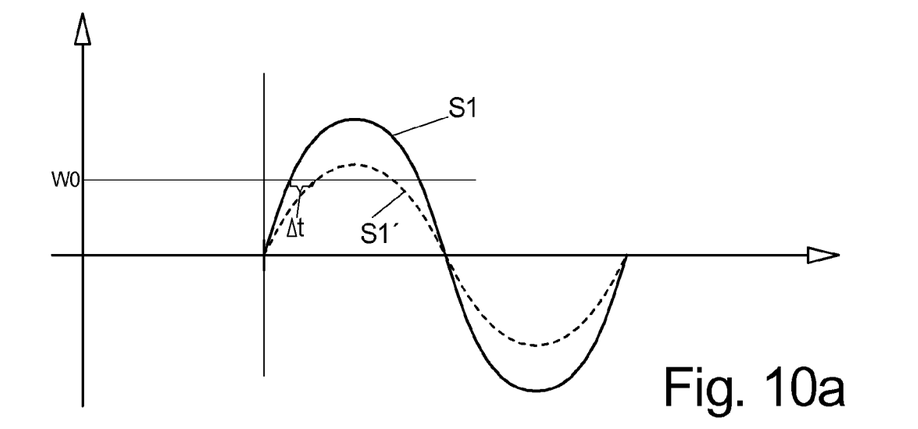
FIGS. 10a, b and c illustrate graphs showing the steps of CFD method.
Figure 10B:
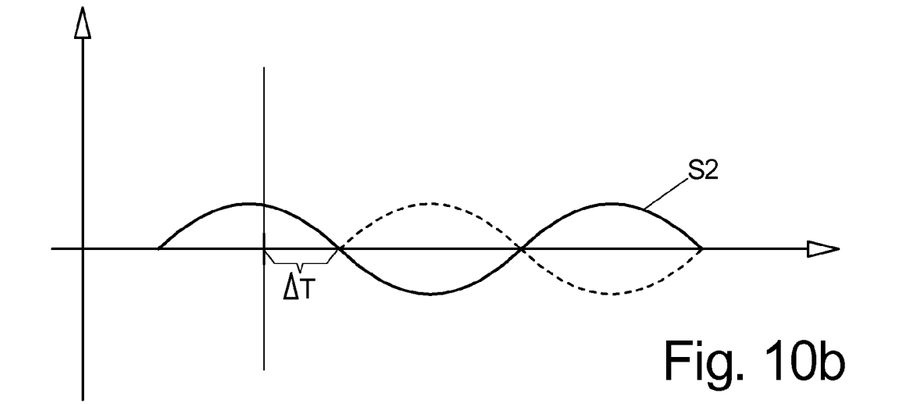
Figure 10C:
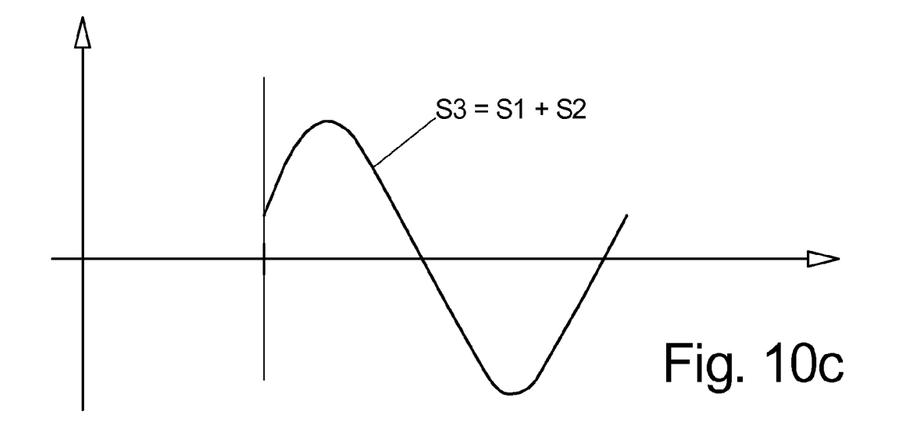

FIG. 10 illustrates another option to improve the measuring result.

When only one detector assembly 105 is provided for a position sensor according to the invention, e.g. a single XMR sensor 1, which is typical, this XMR sensor 1 generates e.g. the signal S1 as illustrated in FIG. 10a.

Thus, a particular signal value W0 is predetermined as a switching threshold and thus point in time of arrival of the mechano-elastic density wave at the detector assembly.

Since depending on environmental impacts like temperature the amplitude and thus the flank slope of the signal S1 varies and could as well be S1', the measuring result can vary by a time differential $\Delta t$ as a function thereof which represents a measurement imprecision.

The constant fraction discriminator method (CFD) which is known in principle facilitates determining an exact point in time from analog broad impulses with variable signal amplitude and variable flank slopes. This is achieved in that the amplitude level and thus the flank steepness of the signal is eliminated thus by generating a virtual second signal S2 from the output signal S1 and subsequently adding the two signals S1 and S2 to form a sum signal S3.

The virtual second signal S2 as illustrated in FIG. 10b is generated from the output signal S1 in that it is moved by a fixed amount of time $\Delta T$, in particular delayed, wherein the amount of time is smaller than the rise time of the output signal. Additionally the output signal is inverted and multiplied with a factor which is between 0 and 1.

The addition yields a sum signal S3 whose zero passage with positive rise is independent from the amplitude and flank slope of the output signal S1.

According to the invention instead of generating the virtual second signal S2 from the output signal S1 two real signals can be used for S1 and S2 that come from two preferably identical detector assemblies, e.g. XMR sensors offset by a defined amount in longitudinal direction, e.g. along the distance sensors.

Through the offset of the detector arrangements the two signals are time offset anyhow as required for S1 and S2.

In order for the amplitude of the signal arriving at the second detector assembly to be smaller than the amplitude arriving at the first detector assembly the second detector assembly also has a smaller lateral distance from the wave conductor than the first detector assembly.

In order to provide the inversion and subsequent addition of the two signals S1 and S2 only the two XMR sensors have to be connected with one another accordingly, so that also a subtraction of their two signals is provided which is mathematically identical with inverting the one signal and subsequently adding both signals.

This solution requires a second detector assembly, however, it avoids the computational complexity for generating the virtual second signal S2 from a real first signal S1.

In particular there are numerous applications in which two detector assemblies are arranged at one wave conductor anyhow for reasons of redundancy and operational safety. As long as both detector assemblies operate correctly their signals can be directly used as signals S1 and S2 for generating the sum signal S3. Should one of the two detector assemblies fail, operations continue with the remaining functional detector assembly alone through mathematical generation of the virtual signal S2 from the real signal S1. This slightly increases processing time but the distance sensor is still fully functional.

Figure 12A:
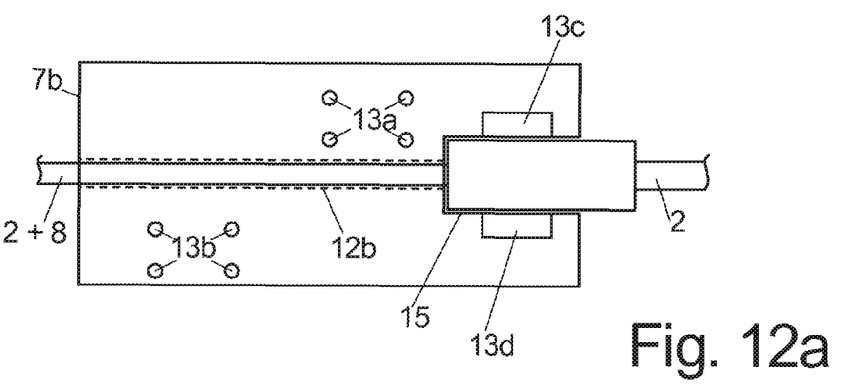
FIGS. 12a and b illustrate a connection of the wave conductor and the XMR sensor.
Figure 12B:
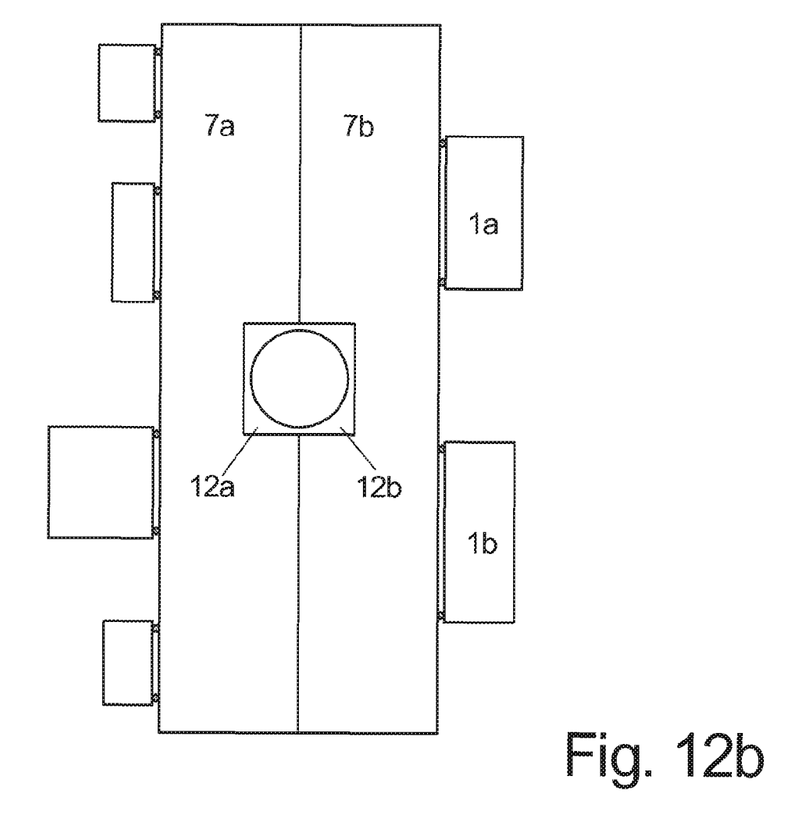

FIG. 12 illustrates a configuration with two XMR sensors 1a, 1b having the functionality recited supra.

The two XMR sensors 1a and 1b and also the other electronic components for signal processing are arranged on the front sides of the circuit interconnection 7a+b provided with conductive paths, wherein the circuit interconnection includes two circuit boards 7a, b with identical circumferential contours which are connected with one another with their backsides, in particular glued together as illustrated in the frontal view of FIG. 12b.

The front view of the circuit board interconnection in FIG. 12a illustrates that the circumferential contour of the particular circuit boards 7a, b is C-shaped with a bulge 15 between its freely extending arms into which the crimp sleeve 14 fits exactly through which the electric signal conductor 8 is electrically clamped onto the wave conductor 2 in its end portion.

From the base of the bulge 15a longitudinal groove 12a, b extends at a backside of each of the circuit boards 7a, b at the same location so that the two non-longitudinal grooves 12a, b when glued against one another form a pass through opening for the signal conductor 8 and the wave conductor 2 extending parallel to one another starting at a sleeve 14.

The attachment is preferably provided through soldering the metal crimp sleeve 14 at solder points 13c, d arranged directly adjacent thereto on the front sides of the circuit boards 7a, b.

In FIG. 12a furthermore illustrates solder points 13a, b that are arranged on the front side of the illustrated circuit board 7b respectively in a square, wherein the contact points are the contact points for soldering on an XMR sensor 1a, 1b which are offset in longitudinal direction and arranged with a different distance from the wave conductor 2 on the circuit board 7a and/or 7b.

As illustrated in FIG. 12b the other components of the processing electronics are also arranged on the outward oriented front sides of the circuit boards 7a, b.

Figure 11:
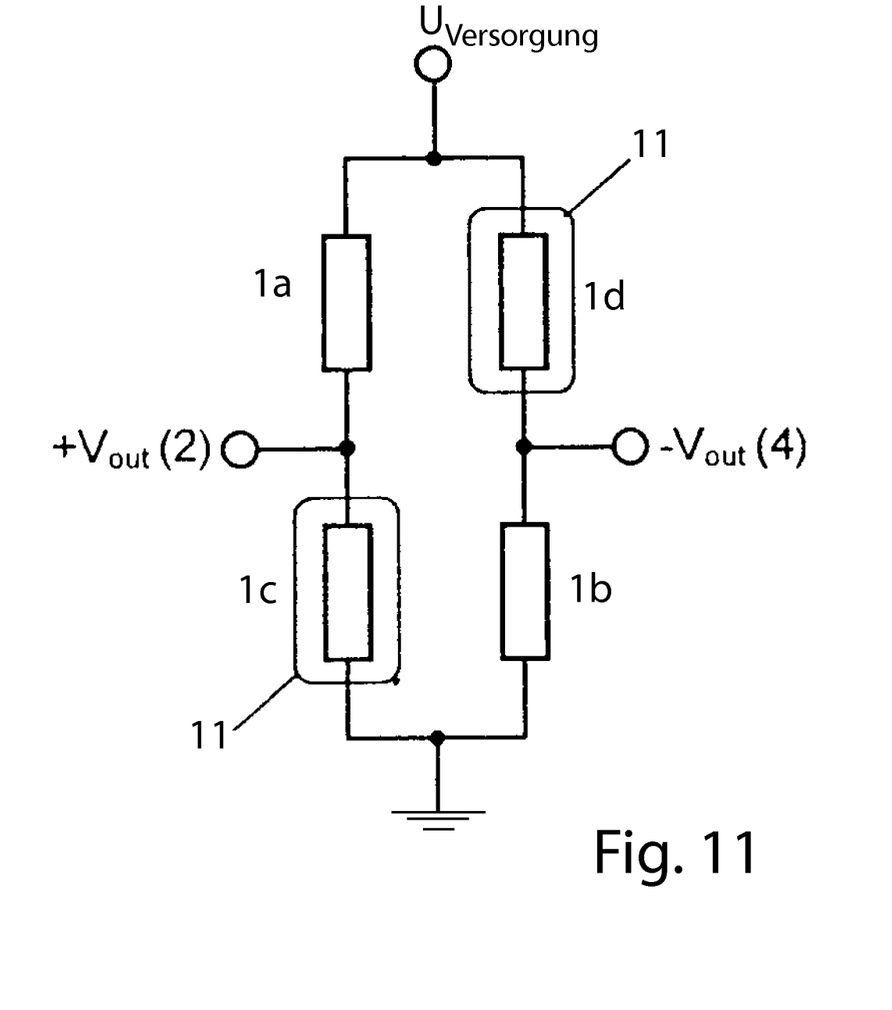
FIG. 11 illustrates an XMR sensor in a bridge circuit.

Since a particular XMR sensor provides a measuring result which strongly depends from environmental impacts like e.g. the current operating temperature of the distance sensor the present application preferably respectively uses a temperature compensating bridge circuit according to FIG. 11 made from a total of four XMR sensors 1a through 1d connected with one another instead of a single XMR sensor, wherein the bridge circuit can be used at any location where a single XMR sensor is recited in the instant application.

Thus two respective XMR sensors 1a and 1b, or 1c, d are respectively arranged on parallel branches of an electrical circuit between grounding and a supply voltage, wherein in one case the first XMR sensor 1c and in the other case the other XMR sensor 1d are covered with a magnetic shield 11, so that they are not influenced by magnetic fields impacting them from the outside, not even by the magnetic fields of the wave conductor 2.

The signal tapping is performed in both branches respectively between the two XMR sensors arranged thereon and the computation of the two tapped signals with one another yields a temperature neutral resulting signal since the non-shielded XMR sensor provides e.g. a rising particular signal in one branch and a declining particular signal in the other branch for a temperature change.

REFERENCE NUMERALS AND DESIGNATIONS 1, 1a, b XMR-Sensor, Sensorchip
1 Bias magnet
2 Wave conductor
4, 4' Villary band
5 Contact point
6 Soldering point
7, 7a, b Circuit board
8 Signal conductor
9 Displacement
10 Main plane
11 Magnetic shielding
12a, b Longitudinal groove
13a-d Solder point
14 Crimp sleeve
15 Bulge
20 Position magnet
105 Detector assembly
B Magnetic induction
H Field strength
Δt Time displacement

The invention claimed is:

1. A position sensor operating according to a runtime principle of a mechano-elastic density wave (MEDW), comprising:
a wave conductor (3) configured as a wire;
a position magnet (20) which is moveable along the wave conductor (3); and
a detector assembly (105) arranged at the wave conductor (3), wherein
the detector assembly (105) includes at least one XMR sensor (1) on the wave conductor, wherein said at least one XMR sensor is spaced from the wave conductor, the detector assembly further including a circuit board located between the at least one XMR sensor and the wave conductor, wherein said at least one XMR sensor is configured as a microchip and where no shielding exists between said at least one XMR sensor and said wave conductor, wherein the at least one XMR sensor is arranged so that a main plane of the at least one XMR sensor extends parallel to a longitudinally extending direction of the wave conductor, the detector assembly further including a bias magnet arranged with its pole orientation parallel to the main plane of the at least one XMR sensor and arranged so that its pole orientation is perpendicular to the longitudinally extending direction of the wave conductor, wherein the wave conductor is located on a first side of the at least one XMR sensor and the bias magnet is located on a second different side of the at least one XMR sensor that is opposite the first side.

2. A method for determining a position of said position magnet (20) of said position sensor according to claim 1 relative to said wave conductor (3) of said position sensor according to claim 1, comprising:
    detecting a changing magnetic induction with said at least one XMR sensor, or detecting a field strength or field orientation with said at least one XMR sensor.

* * * * *